Sept. 24, 1968 W. A. BOOTHE 3,402,727

FLUID AMPLIFIER FUNCTION GENERATOR

Filed Sept. 23, 1964

Torg 137/13
X2360
X2376

X2430
X2471

INVENTOR.
WILLIS A. BOOTHE
BY Gerald L Moore
ATTORNEY 3,402,727
Patented Sept. 24, 1968

3,402,727

FLUID AMPLIFIER FUNCTION GENERATOR

Willis Anson Boothe, Scotia, N.Y., assignor to General Electric Company, a corporation of New York Filed Sept. 23, 1964, Ser. No. 398,605
4 Claims. (Cl. 137—81.5)

This invention relates to a fluid amplifier and more particularly to a fluid amplifier utilizing feed back networks to provide a frequency responsive output.

Fluid amplifiers of the type utilizing a side control jet to deflect the main fluid flow into one of a plurality of receiver passages are well known in the art. It is also known to provide various feed back networks for fluid amplifiers and this invention utilizes specific feed back networks to provide a fluid amplifier whose response varies with the frequency of the input signal. In various control systems where such fluid amplifiers are utilized it is frequently necessary to provide a fluid amplifier having multiple amplification levels responsive to frequency to attenuate signals at some frequency levels while further amplifying signals at other frequency levels for effective control response. This invention provides such a fluid amplifier which responds at different amplification levels to different frequency signals, such a function is commonly referred to as a lead-lag function.

It is therefore one object to provide a fluid amplifier whose response varies with the frequency of the input signal.

It is a further object of this invention to provide a fluid amplifier utilizing a feed back network to provide an output responsive to signal frequency.

It is another object of this invention to provide a fluid amplifier utilizing a fluid reactance in the feed back network to provide an output signal responsive to the frequency of the input signal.

In accordance with these and other objects of the invention there is provided in one embodiment of the invention a fluid amplifier utilizing a power nozzle with input control nozzles to vary the flow to various receiver ports in the amplifier, with feed back control nozzles receiving flow from the receiver ports responsive to flow in each receiver which when the input control signal is at a low frequency, provides a high negative feed back flow through the feed back control nozzle and at higher frequencies, due to the fluid inductance or capacitance in the feed back network, attenuates the feed back signal so that higher signal amplification is effected through the fluid amplifier.

Figure 1:
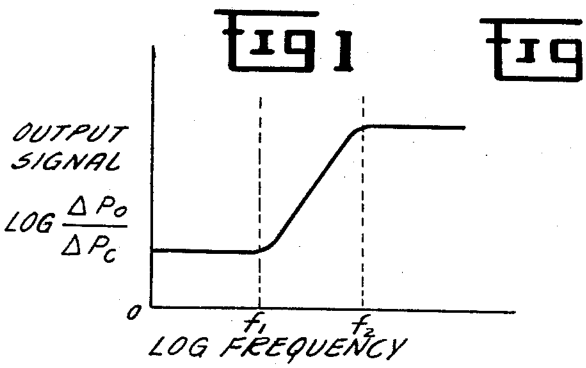
Figure 2:
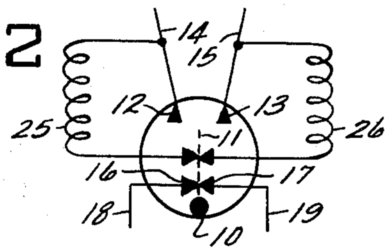
Figures 3, 4:
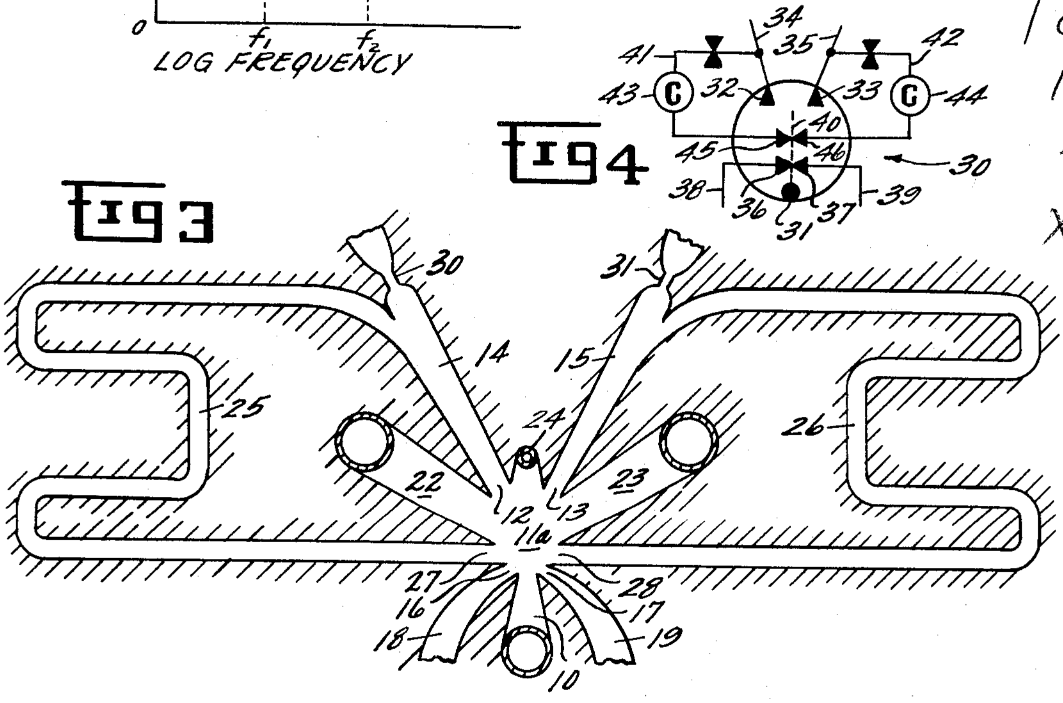
Figure 5:
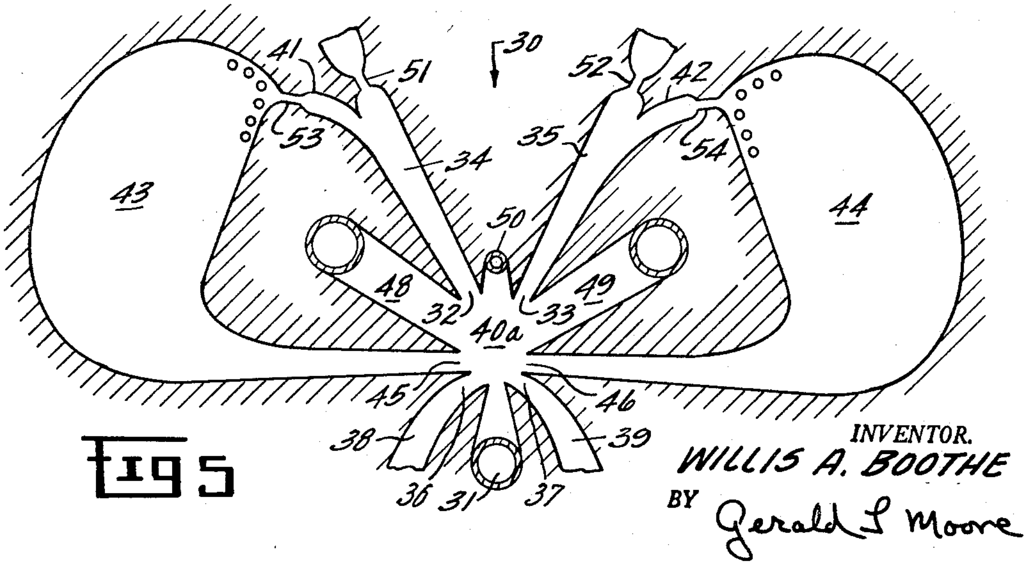

Other objects and many of the attendant advantages of this invention will be readily appreciated as the same becomes better understood by reference to the following detailed description when considered in connection with accompanying drawings wherein:

FIG. 1 illustrates graphically one amplification response versus frequency which may be affected by this invention, FIG. 2 illustrates schematically one embodiment of the invention utilizing a fluid inductance feed back, FIG. 3 illustrates in cross-section the embodiment shown schematically in FIG. 2, FIG. 4 illustrates schematically a second embodiment of the invention, and FIG. 5 illustrates in cross-section the embodiment shown schematically in FIG. 4.

Referring to the drawings and specifically to FIG. 1, there is illustrated a graph having frequency as the abscissa axis and the delta P-out over delta P control as the ordinate axis, or the signal output divided by the signal input, showing graphically that the subject amplifier has a substantially constant response up to a frequency indicated as $f_1$ with a rising gain from frequency $f_1$ to frequency $f_2$, and substantially constant amplification at frequencies greater than $f_2$. One method of measuring this gain is by dividing the output signal pressure by the control signal pressure as indicated on the abscissa axis of the graph. Such gain functions are desired in control circuits to provide a signal responsive to the signal frequency to make the signal more controlling at different frequencies due to the specific requirements of the control. By this invention there is provided a fluid amlifier providing this function.

Referring now to FIGS. 2 and 3 therein is illustrated one embodiment of the invention comprising a fluid amplifier having a power nozzle 10 through which fluid is applied, preferably under a constant pressure, forming a jet which normally issues as indicated by the dotted line 11 impinging equally on receivers 12 and 13. Connected to conduits 18 and 19 are control nozzles 16 and 17 which are positioned such that fluid flow through the control nozzles will divert the jet into either of the receivers 12 and 13, with the amount of diversion depending on the force of the flow coming from the control nozzle. For instance if control fluid flow is provided through control nozzle 16 the jet will be diverted toward the receiver 13. Vents 22 and 23 are also provided adjacent the fluid jet chamber 11*a* which communicate with atmosphere or a suitable drain and serve to drain off any excess fluid from the jet chamber. Also a cusp 24 is provided between the receiver 12 and 13 connecting with atmosphere or a suitable drain for receiving and draining the fluid not diverted to either of the receivers.

To explain the feed back system of the amplifier, as the fluid enters either the receiver 12 or 13 and flows through the conduit 14 and 15, a small portion is diverted through the inductor passage 25 or 26 and allowed to flow back to either of the feed back control nozzles 27 or 28. Restrictors 30 or 31 are provided in the conduits 14 and 15 to control the back pressure within the conduits 14 and 15 and affect the amount of feed back through the inductor passages. Passages 25 and 26 are called inductor passage since they are proportioned to be relatively long and thus present a high reactance to fluid flow. Since the passages are large they present a low resistance to flow thereby requiring very little pressure drop to be maintained across the passage to maintain steady state fluid flow. Therefore the resistance to steady state flow through the passage is relatively small compared to the reactance of the passage.

To explain the operation of this embodiment of the invention, under steady state conditions a constant pressure of fluid is injected through the power nozzle 10 and to pass into the cusp 24 to atmosphere. If there is any flow through the receiver 12 and 13 it is equal flow in each. However, the introduction of a control fluid flow such as through the conduit 18 and the nozzle 16 diverts the power jet toward the receiver 13 to flow through conduit 15. A portion of the flow enters the inductor passage 26 to flow back through feedback control nozzle 28 to tend to divert the power jet away from the receiver 13 and toward the receiver 12 thereby serving a negative feed back function. In the instance where the flow through the control nozzle 16 and 17 are varied sinusoidally, that is the delta P between the control nozzles 16 and 17 alternate uniformly between high and low pressure, alternately high recoveries are effected in the receivers 12 and 13. When the frequency of the sinusoidal oscillation is quite low, flow through the feed back ports 27 and 28 would be quite strong resulting in a tendency to cancel the effect of the input signals through the control nozzles. As a result the amplifier gain at low frequencies is low resulting from the negative feed back signal supplied through the inductor pasages 25 and 26. As the frequency of the control nozzle flow change is increased the attenuation of the feed back signal or feed back flow through the inductor passages 25 and 26 is greater due to the reactance of the passage thus presenting a higher attenuation to flow and reducing the feed back control flow through the feed back control nozzles 27 and 28. Since this is a negative feed back this allows for higher gain through the fluid amplifier by providing less negative or bucking feed back flow to the fluid amplifier. Therefore the output of the fluid amplifier can be caused to approximate that illustrated in FIG. 1 where $f_1$ is a frequency below which the inductor effect of the feed back passages is negligible, $f_1$ to $f_2$ is the range through which the reactance progressively effects the feed back signal as the frequency increases, and $f_2$ is the higher frequency where the feed back signal is substantially all attenuated and thereby ineffective in negating effect of the control fluid flow to the fluid amplifier.

A second embodiment of this invention is illustrated in FIGS. 4 and 5 showing a fluid amplifier 30 having a power nozzle 31 with receives 32 and 33 connected to conduits 34 and 35 and the input control nozzles 36 and 37 connected to conduits 38 and 39. In the same manner as the first embodiment a power jet 40 is expelled from the power nozzle 31 and may be deflected into either of the receivers 32 and 33. Connected to conduits 34 and 35 are feed back passages 41 and 42 including a fluid capacitance 43 and 44 and extending on to feed back control nozzles 45 and 46. The fluid capacitances 43 and 44 offer low resistance to fluid flow yet present a high reactance to flow change due to their large fluid volume.

As illustrated in FIG. 5, vents 48 and 49 connect with the jet cavity 40*a* and extend to atmosphere or suitable drain to expel excess fluid. Similarly a cusp 50 connecting to atmosphere or suitable drain is provided to receive fluid not diverted to either receiver. Restrictors 51 and 52 are positioned in conduits 34 and 35 to control the amount of flow into the feed back passages 41 and 42, similarly restrictors 53 and 54 are positioned in the feed back passages for the same purpose. The capacitors 43 and 44 may be one of two general types, if a compressible liquid such as air is utilized the fluid capacitor illustrated may be used comprising a predetermined volume for containing an amount of fluid, if a non-compressible fluid is utilized such as liquid, the capacitor may be a type of accumulator such as a spring loaded piston, air bag or the equivalent.

To explain the operation of this embodiment of the invention, with the power jet flow 40 issuing from the power nozzle 31 an input control signal through one control nozzle such as control nozzle 37 will divert the power jet towards the receiver 32 in an amount proportional to the fluid flow through the control nozzle. Fluid flowing through the conduit 34 will pass through the restrictor 51 with a portion of the flow entering the feed back conduit 41, passing through the restrictor 53 and into the capacitor 43 to thereafter flow through the feed back control nozzle 45 and exert a force on the power jet 40 tending to divert it away from the receiver 32. At slow changes in the fluid flow through the input control nozzles the quantity of fluid will enter the feed back passages 41 and 42 and fill the connecting capacitors to thereafter flow through the feed back control nozzle to provide a negative feed back signal. Referring now to FIG. 1 this would correspond to the frequency range below $f_1$ where the negative feed back is sufficient to maintain the amplifier at a lower amplification level. However, the signals entering the conduit 41 and the capacitor 43 are attenuated in the capacitor as the frequency of the control signal rises to provide the function generated between $f_1$ and $f_2$ of FIG. 1 until the frequency reaches a level of $f_2$, when the feed back signal is attenuated sufficiently by the effect of the fluid capacitors to provide a very low feed back signal. The posts 54 within the capacitors 43 and 44 are provided to break up the flow and prevent it from passing directly through the capacitor as it might by adhering to one of the walls of the capacitor.

From the foregoing description, it may be seen there is provided a fluid amplifier function generator having a plurality of amplification levels dependent upon the frequency of the output flow change as determined by the frequency of the input control signal. Of course, a more complex function could be generated if multiple feed back paths were used which may or may not use attenuation components to affect the feed back signal as desired. Also multiple power amplifiers could be utilized with the feed back network operable around all the amplifiers. Therefore while particular embodiments of the invention have been illustrated and described, it will be obvious to those skilled in the art that various changes and modifications may be made without departing from the invention and it is intended to cover in the appended claims all such changes and modifications that come within the true spirit and scope of the invention.

What is claimed as new and desired to be secured by Letters Patent of the United States is:

1. A fluid amplifier comprising,
- a power nozzle from which a fluid power jet is discharged,
- a pair of receivers downstream of said nozzle, said receivers comprising passageways respectively having entrances on opposite sides of the nominal path of the power jet and outlets from which an output signal is derived,
- a pair of control ports respectively disposed on opposite sides of said power jet whereby pressure signals at said control ports will deflect said power jet towards one or the other of said receivers to alternately change the pressurization of said receivers and provide an output signal therefrom,
- a pair of feedback ports respectively disposed on opposite sides of said power jet,
- venting means between said ports and said receivers, and
- flow restrictive, passageway means respectively connecting each receiver passageway with the feedback port on the same side of said power jet, said connecting passageway means pressurizing each feedback port to a lesser degree than the respective receiver passageway, in opposition to the control signal which has pressurized the receiver to which the feedback port is connected,
- means, downstream of each connecting passageway means for restricting flow through said receiver passageways and thus assuring the relative pressurization of said receiver passageways and said feedback ports,
- said connecting passageway means further including means for attenuating relatively rapid pressure variations in the flow of fluid therethrough, whereby, for a given strength control signal, the receiver signal pressure will increase as the opposition signal decreases with higher rates of change in receiver signal pressure.

2. A fluid amplifier as in claim 1 wherein,
the means for attenuating the feedback signal comprise a fluidic capacitance having a relatively long flow path and relatively low resistance to fluid flow, thereby providing an inertial attenuation of the feedback signal, particularly where liquids are employed as the motive fluid for the fluidic device.

3. A fluid amplifier as in claim 2 wherein the attenuating means comprise a fluidic capacitance volume and a resistance disposed between said receiver and said capacitance volume.

4. A method of using a fluid amplifier, having structure as defined in claim 1, comprising the steps of,
progressively increasing the frequency of variation of signal pressures at the control ports of said fluid amplier, and obtaining an amplified output signal from said receivers having an increase in gain as the frequency of the input signal pressures increases from one critical value to another.

References Cited

UNITED STATES PATENTS

| | | | |
|---|---|---|---|
| 3,024,805 | 3/1962 | Horton | 137—81.5 |
| 3,075,548 | 1/1963 | Horton | 137—81.5 |
| 3,117,593 | 1/1964 | Sower | 137—81.5 |
| 3,148,691 | 9/1964 | Greenblott | 137—81.5 |
| 3,159,168 | 12/1964 | Reader | 137—81.5 |
| 3,185,166 | 5/1965 | Horton et al. | 137—81.5 |
| 3,223,101 | 12/1965 | Bowles | 137—81.5 |

SAMUEL SCOTT, *Primary Examiner.*